(12) United States Patent
Vasiliu

(10) Patent No.: US 8,399,959 B2
(45) Date of Patent: Mar. 19, 2013

(54) PROGRAMMABLE POLY FUSE

(75) Inventor: Laurentiu Vasiliu, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 385 days.

(21) Appl. No.: 11/807,975

(22) Filed: May 30, 2007

(65) Prior Publication Data

US 2008/0296727 A1 Dec. 4, 2008

(51) Int. Cl.
*H01L 23/52* (2006.01)
*H01L 29/04* (2006.01)

(52) U.S. Cl. .......... 257/530; 257/209; 257/529; 257/50; 257/E21.661; 257/528; 438/131; 438/433; 438/467; 438/600

(58) Field of Classification Search .................. 257/529, 257/E23.149, 131, 50, 530, 209, E23.147, 257/528, E21.661, E21.662; 438/132, 600, 438/467, 131, 433; 324/550
See application file for complete search history.

(56) References Cited

U.S. PATENT DOCUMENTS

| | | | | |
|---|---|---|---|---|
| 5,708,291 A * | 1/1998 | Bohr et al. | ..................... | 257/529 |
| 5,852,323 A * | 12/1998 | Conn | ............................ | 257/530 |
| 5,969,404 A * | 10/1999 | Bohr et al. | ..................... | 257/529 |
| 5,991,187 A * | 11/1999 | Cutter et al. | ..................... | 365/96 |
| 6,031,275 A * | 2/2000 | Kalnitsky et al. | ............. | 257/530 |
| 6,323,535 B1 * | 11/2001 | Iyer et al. | ....................... | 257/529 |
| 6,815,264 B2 * | 11/2004 | Stribley et al. | ................ | 438/131 |
| 6,815,797 B1 * | 11/2004 | Dark et al. | ..................... | 257/530 |
| 6,933,591 B1 * | 8/2005 | Sidhu et al. | ................... | 257/665 |
| 2005/0258505 A1 * | 11/2005 | Wu et al. | ....................... | 257/529 |
| 2007/0222028 A1 * | 9/2007 | Matsuoka et al. | ............ | 257/529 |
| 2008/0217736 A1 * | 9/2008 | Cestero et al. | ................ | 257/530 |

OTHER PUBLICATIONS

Philip Palpante (Ed.): Electrical Engineering Dictiionary., Boca Raton: CRC Press LLC, 2000; 4 pages relaed to definitions of a fuse and an antifuse.*

* cited by examiner

*Primary Examiner* — Colleen Matthews
*Assistant Examiner* — Galina Yushina
(74) *Attorney, Agent, or Firm* — Farjami & Farjami LLP

(57) ABSTRACT

According to one exemplary embodiment, a programmable poly fuse includes a P type resistive poly segment forming a P-N junction with an adjacent N type resistive poly segment. The programmable poly fuse further includes a P side silicided poly line contiguous with the P type resistive poly segment and coupled to a P side terminal of the poly fuse. The programmable poly fuse further includes an N side silicided poly line contiguous with the N type resistive poly segment and coupled to an N side terminal of the poly fuse. During a normal operating mode, a voltage less than or equal to approximately 2.5 volts is applied to the N side terminal of the programmable poly fuse. A voltage higher than approximately 3.5 volts is required at the N side terminal of the poly fuse to break down the P-N junction.

20 Claims, 5 Drawing Sheets

US 8,399,959 B2

PROGRAMMABLE POLY FUSE

BACKGROUND OF THE INVENTION

1. Field of the Invention

The present invention is generally in the field of electronics. More particularly, the invention is in the field of semiconductor structures.

2. Background Art

Programmable fuses, such as programmable fuses that are electrically blowable, can be utilized in integrated circuit (IC) chips to perform various functions such as, for example, providing redundancy in semiconductor memory, such as static random access memory (SRAM), adjusting the frequency of semiconductor LC oscillators, and selecting an I/O interface for a particular application. A conventional programmable fuse, such as a conventional polysilicon (poly) gate fuse, requires a high voltage to program the fuse. As device dimensions, such as gate oxide thickness, are scaled down in size in advanced technologies, the high programming voltage required by conventional poly gate fuses, for example, can cause an increase in gate oxide leakage current, which can undesirably affect the operation of the fuses.

A conventional poly gate fuse can include a poly gate situated over a gate oxide layer, which can be formed on a substrate. The conventional poly gate fuse can be programmed by applying a sufficiently high voltage, such as a voltage of between 6.0 and 7.0 volts, to the poly gate so as to cause the gate oxide layer to breakdown, thereby causing the poly gate to short to the substrate. However, as gate oxide is scaled down in thickness, the high voltage required to program the poly gate fuse can cause increased leakage in the gate oxide layer, which can undesirably increase the number of programming cycles required to permanently break down the gate oxide layer. Also, high programming voltage can cause an undesirable increase in leakage current in circuits associated with the conventional poly gate fuse, such as charge pumps that provide the programming voltage.

SUMMARY OF THE INVENTION

A programmable poly fuse substantially as shown in and/or described in connection with at least one of the figures, as set forth more completely in the claims.

DETAILED DESCRIPTION OF THE INVENTION

The present invention is directed to a programmable poly fuse. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
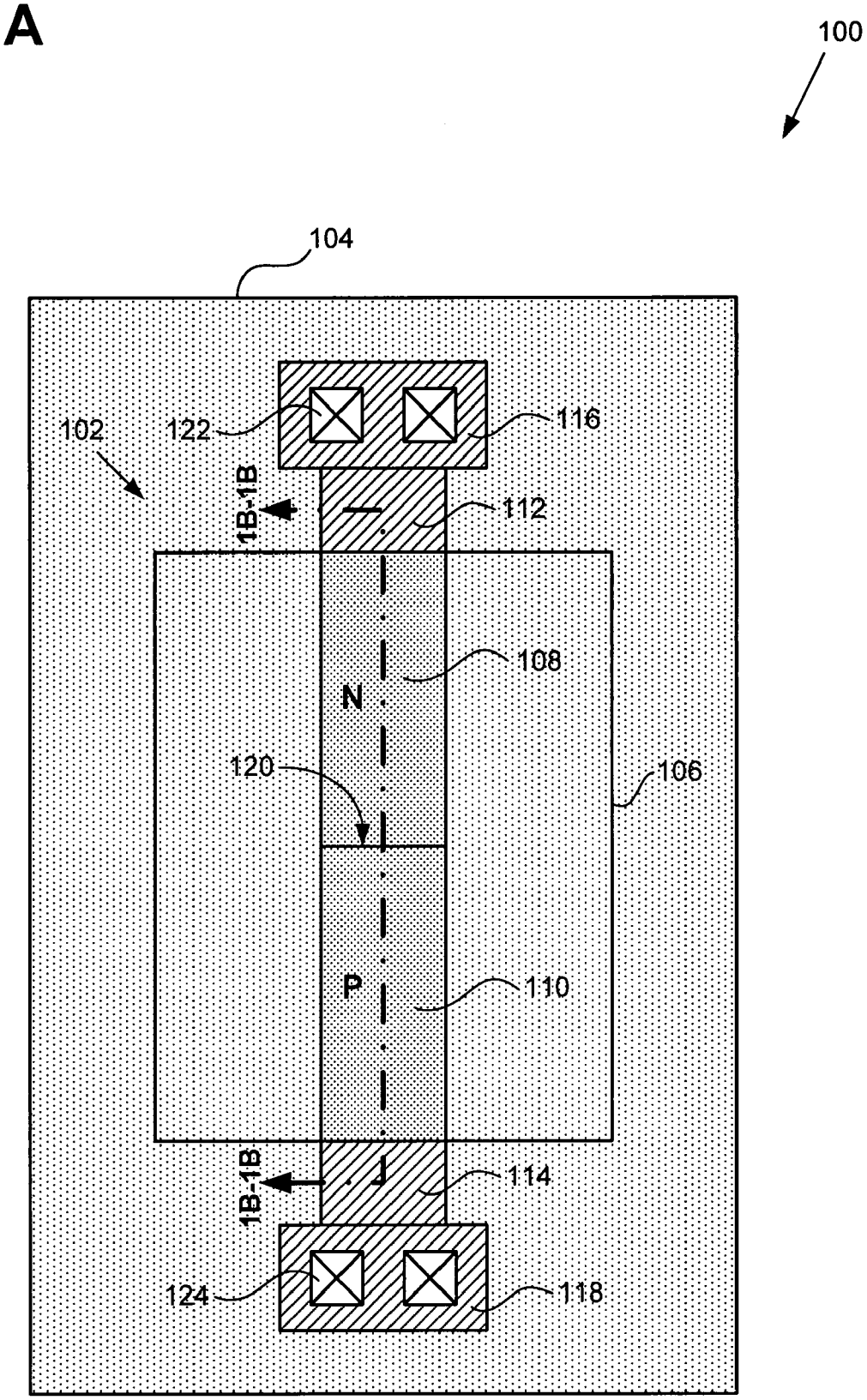
FIG. 1A illustrates a top view of an exemplary structure including an exemplary programmable poly fuse in accordance with one embodiment of the present invention.

FIG. 1A shows a top view of structure 100 in accordance with one embodiment of the present invention. Structure 100 includes programmable poly (polysilicon) fuse 102 (also referred to simply as "poly fuse 102"), dielectric region 104, and silicide blocking layer 106. Poly fuse 102 includes N type resistive poly segment 108, P type resistive poly segment 110, N side silicided poly line 112, P side silicided poly line 114, N side terminal 116, and P side terminal 118. Structure 100 can be a portion of a semiconductor die including a memory array, such as a read only memory (ROM) array, an oscillator, processor, or any other type of circuit that can utilize one or more of the invention's programmable poly fuses (it is noted that a semiconductor die is also referred to as a "chip" or simply as a "die" in the present application).

As shown in FIG. 1A, poly fuse 102 is situated over dielectric region 104, which is situated on a substrate (not shown in FIG. 1A). Dielectric region 104 electrically isolates poly fuse 102 from the substrate (not shown in FIG. 1A) and can comprise silicon oxide or other suitable dielectric material. In the present embodiment, dielectric region 104 can be a shallow trench isolation (STI) region. In one embodiment, dielectric region 104 can be field oxide region.

Also shown in FIG. 1A, P type resistive poly segment 110 is situated adjacent to N type resistive poly segment 108, which are situated over dielectric region 104 and under silicide blocking layer 106. P type resistive poly segment 110 can comprise heavily doped P type polysilicon and can have a resistance of, for example, approximately 700 ohms per square. P type resistive poly segment 110 can be doped with Boron or other suitable P type dopant. N type resistive poly segment 108 can comprise heavily doped N type polysilicon and can have a resistance of, for example, approximately 300 ohms per square. N type resistive poly segment 108 can be doped with Arsenic, Phosphorus or other suitable N type dopant.

Silicide blocking layer 106, which can comprise silicon oxide or other suitable dielectric material, is situated over to N type and P type resistive poly segments 108 and 110 so as to prevent silicide from forming on the poly segments. As a result, a P-N junction, i.e., a diode, is formed at interface 120, i.e., the boundary between P type resistive poly segment 110 and N type resistive poly segment 108. Further shown in FIG. 1A, N side silicided poly line 112 is contiguous with N type resistive poly segment 108 and coupled to N side terminal 116 of poly fuse 102. N side silicided poly line 112 can comprise a silicide layer overlying a line of heavily doped N type polysilicon. N side terminal 116, which forms a program/read node for poly fuse 102, can comprise a silicide segment overlying a segment of heavily doped N type polysilicon.

Also shown in FIG. 1A, P side silicided poly line 114 is contiguous with P type resistive poly segment 110 and coupled to P side terminal 118 of poly fuse 102. P side silicided poly line 114 can comprise a silicide segment overlying a line of heavily doped P type polysilicon. P side terminal 118, which forms a ground node for poly fuse 102, can comprise a silicide segment overlying a segment of heavily doped P type polysilicon. Further shown in FIG. 1A, N side terminal 116 and P side terminal 118 can each be connected to one or more metal contacts, such as respective metal contacts 122 and 124. However, as is manifestly appreciated by one of ordinary skill in the art, N side terminal 116 and P side terminal 118 can each also be connected to a metal-filled via or other suitable type of conductive material.

Figure 1B:
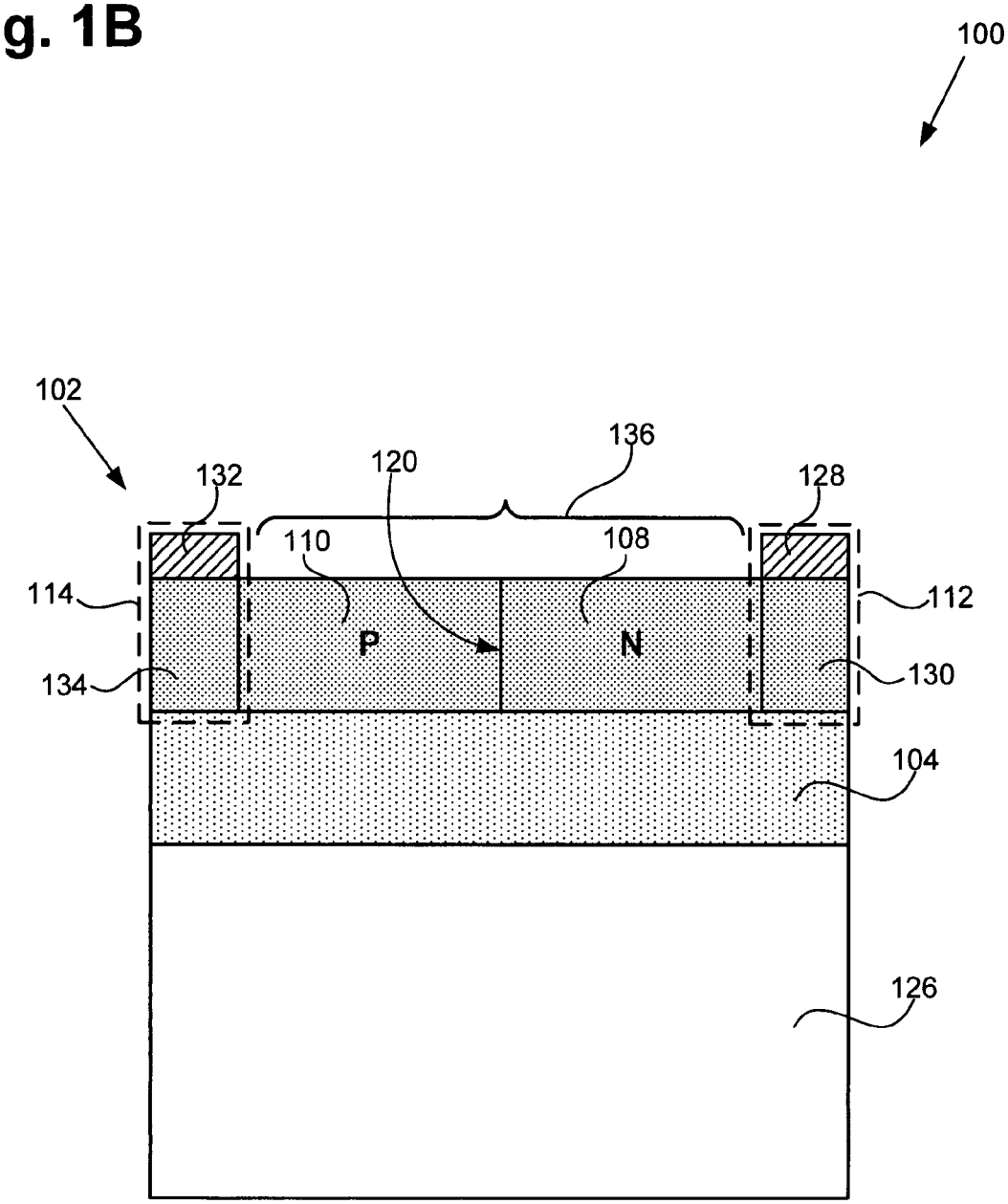
FIG. 1B illustrates a cross sectional view of the exemplary structure in FIG. 1A.

FIG. 1B shows a cross-sectional view of structure 100 in FIG. 1A along line 1B-1B in FIG. 1A. In particular, poly fuse 102, dielectric region 104, N type resistive poly segment 108, P type resistive poly segment 110, N side silicided poly line 112, P side silicide poly line 114, and interface 120 correspond to the same elements in FIG. 1A and FIG. 1B. As shown in FIG. 1B, dielectric region 104 is situated on substrate 126 and N type resistive poly segment 108, P type resistive poly segment 110, N side silicided poly line 112, and P side silicide poly line 114 of poly fuse 102 are situated on dielectric region 104. Also shown in FIG. 1B, N side silicided poly line 112 comprises silicide segment 128 situated on polysilicon line 130 and P side silicided poly line 114 comprises silicide segment 132 situated on polysilicon line 134. Silicide segments 128 and 132 can comprise, for example, cobalt or nickel. Further shown in FIG. 1B, silicide is prevented from forming in region 136, which includes N type resistive poly segment 108 and P type resistive poly segment 110, by silicide blocking layer 106 (shown in FIG. 1A). As a result, a P-N junction forms between P type resistive poly segment 110 and N type resistive poly segment 108 at interface 120.

The operation of poly fuse 120 will now be discussed in relation to FIGS. 1A and 1B. In a normal operating mode, a voltage of approximately 2.5 volts or less is applied to N side terminal 116 of poly fuse 102, and a significantly lower voltage, such as a ground voltage of approximately 0.0 volts, is applied to P side terminal 118 of poly fuse 102. As a result, the P-N junction, i.e., the diode, formed at interface 120 is reverse-biased, which causes only a minimal reverse bias diode leakage current to flow between N side terminal 116 and P side terminal 118 of poly fuse 102. Thus, in the normal operating mode, a very high resistance, e.g., a resistance greater than 10.0 mega ohms, is formed between N side terminal 116 and P side terminal 118, which causes poly fuse 102 to essentially function as an open circuit.

To program poly fuse 120, a high voltage, i.e., a high reverse-bias voltage, higher than approximately 3.5 volts, is applied to N side terminal 116 and a low voltage, which can be, for example, approximately 0.0 volts, is applied to P side terminal 118 so as to cause a reverse bias breakdown in the P-N junction, i.e. the diode, at interface 120, thereby changing a state of the P-N junction so as to form a fuse resistance, which can be, for example, less than approximately 10.0 ohms. The breakdown of the P-N junction can occur through either avalanche or Zener breakdown as known in the art. Thus, the reverse bias breakdown in the P-N junction, i.e., the diode, at interface 120 changes the state of the P-N junction so as to cause the resistance of at interface 120 to be reduced from a reverse bias resistance of approximately 10.0 mega ohms or greater prior to programming to a fuse resistance of less than approximately 10.0 ohms after programming.

After poly fuse 102 has been programmed, the resistance of poly fuse 102 is equal to the sum of the resistance of N type resistive poly segment 108 ($R_N$), the fuse resistance of the broken down P-N junction at interface 120 ($R_D$), and the resistance of P type resistive poly segment 110 ($R_P$), where $R_D$ is less than 10.0 ohms and $R_N+R_P$ is, for example, less than or equal to approximately 10.0 kilo ohms. Thus, after poly fuse 102 has been programmed, the resistance of poly fuse 102, i.e., the resistance between N side terminal 116 and P side terminal 118 is substantially equal to $R_N+R_P$, e.g., less than or equal to approximately 10.0 kilo ohms. Thus, before programming, i.e., before the P-N junction is blown or broken down, the P-N junction at interface 120 is reverse-biased, which causes the resistance of poly fuse 102, i.e., the reverse bias resistance, to be approximately 10.0 mega ohms or greater—practically an open circuit. After programming, i.e., after the P-N junction has been broken down, the resistance of poly fuse 102 is substantially equal to $R_N+R_P$, e.g., less than or equal to approximately 10.0 kilo ohms, which is essentially a short circuit compared to the resistance of poly fuse 102 prior to programming. Thus, based on the resistance of poly fuse 102, poly fuse 102 can be in a "1" state before programming and in a "0" state after programming, or vice versa, depending on the requirements of a particular application.

To limit the current flow after programming, i.e., after breakdown of the P-N junction, to an acceptable level, $R_N+R_P$, i.e., the resistance of N type resistive poly segment 108 plus the resistance of P type resistive poly segment 110, can be selected to be, for example, approximately 10.0 kilo ohms.

In the present invention, once the P-N junction, i.e., the diode, formed at interface 120 between N type resistive poly segment 108 and P type resistive poly segment 110 has been broken down during programming, it (i.e. the P-N junction) is permanently broken down. As a result, the programmed state of the invention's poly diode fuse cannot change as a result of voltage or temperature stress. In contrast, in a conventional poly gate fuse, the poly gate fuse is programmed by causing a short to form in the gate oxide layer, thereby shorting the poly gate to the substrate, i.e., ground. However, due to subsequent voltage or temperature stresses, the gate oxide layer may open up, thereby causing the conventional poly gate fuse to change states, i.e., to change from a "1" to a "0," or vice versa. Thus, in contrast to the conventional poly gate fuse, the programmed state of invention's poly fuse cannot shift after it (i.e., the invention's poly diode fuse) has been programmed.

Also, since the invention's poly diode fuse is not dependent on gate oxide breakdown or shorting for programming, the invention's poly diode fuse is not affected by the scaling down of gate oxide thickness that typically occurs as technology advances. In contrast, the conventional poly gate fuse relies on a gate oxide layer that is typically the same gate oxide layer that is utilized in a core section of the IC chip in which the poly gate fuse resides. Thus, as the thickness of the gate oxide layer is scaled down in advanced technologies, the thinner gate oxide can undesirably affect the operation of the conventional poly gate fuse by, for example, increasing leakage current. Thus, by being independent of gate oxide thickness, the invention's poly diode fuse provides increased scalability compared to the conventional poly gate fuse.

In addition, the high voltage, e.g., a voltage higher than approximately 3.5 volts, required to program the invention's poly diode fuse is significantly lower than the high voltage, e.g., between approximately 6.0 volts and 7.0 volts, required to program the conventional poly gate fuse. By significantly reducing the high voltage required for fuse programming, the invention's poly fuse correspondingly reduces leakage current in the charge pumps that are typically utilized to provide the programming voltage. Furthermore, the invention's poly fuse permanently breaks down once the programming voltage is increased to a voltage level that causes an avalanche or Zener breakdown process to initiate. In contrast, as a result of leakage current in the gate oxide layer, the conventional poly gate fuse typically requires multiple programming cycles to cause the gate oxide to break down, where the time of each subsequent programming cycle is increased. Thus, by requiring a significantly lower programming voltage, the invention's poly diode fuse advantageously reduces charge pump leakage caused by the higher programming voltage required by the conventional poly gate fuse.

Also, due to gate oxide quality, a particular gate oxide layer may not breakdown even after multiple programming cycles, which undesirably reduces the reliability of the conventional poly gate fuse. As a result, applications utilizing conventional poly gate fuses require redundant poly gate fuses. Thus, the invention's poly diode fuse is significantly more reliable compared to the conventional poly gate fuse.

Figure 2:
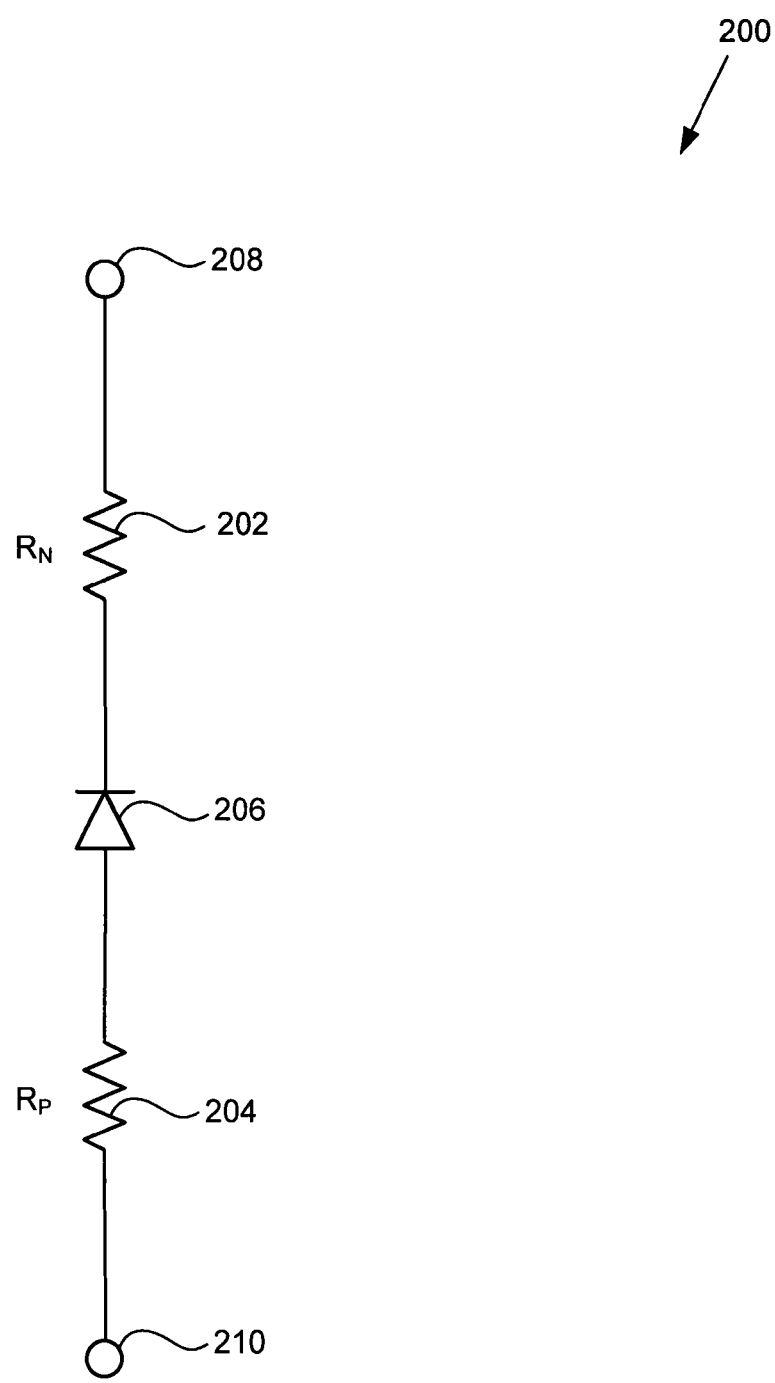
FIG. 2 illustrates a schematic diagram of the exemplary programmable poly fuse of FIGS. 1A and 1B prior to programming in accordance with one embodiment of the present invention.

FIG. 2 shows a schematic diagram corresponding to poly fuse 102 in structure 100 of FIGS. 1A and 1B prior to programming. In diagram 200, resistor 202, diode 206, and resistor 204 correspond, respectively, to N type resistive poly segment 108, the P-N junction at interface 120, and P type resistive poly segment 10 of poly fuse 102 prior to programming. Also in diagram 200, N side and P side terminals 208 and 210 correspond to respective N side and P side terminals 116 and 118 of poly fuse 102 in FIGS. 1A and 1B. As shown in FIG. 2, resistor 204, which has a resistance equal to $R_P$, diode 206, which has a reverse bias resistance equal to or greater than approximately 10.0 mega ohms, and resistor 202, which has a resistance equal to $R_N$, are connected in series between P side terminal 210 and N side terminal 208, where $R_N+R_P \leq 10.0$ kilo ohms, for example. Also, prior to programming, diode 206, i.e., the P-N junction at interface 120 of poly fuse 102, is reverse biased. Thus, prior to programming, poly fuse 102 has a resistance that is substantially equal to the reverse bias resistance of diode 206, which can be, for example, approximately 10.0 mega ohms or greater. Prior to programming, reverse bias resistance of poly fuse 102, which is essentially an open circuit, can be associated with a logic state of "0" or "1," depending on the requirements of a particular application.

Figure 3:
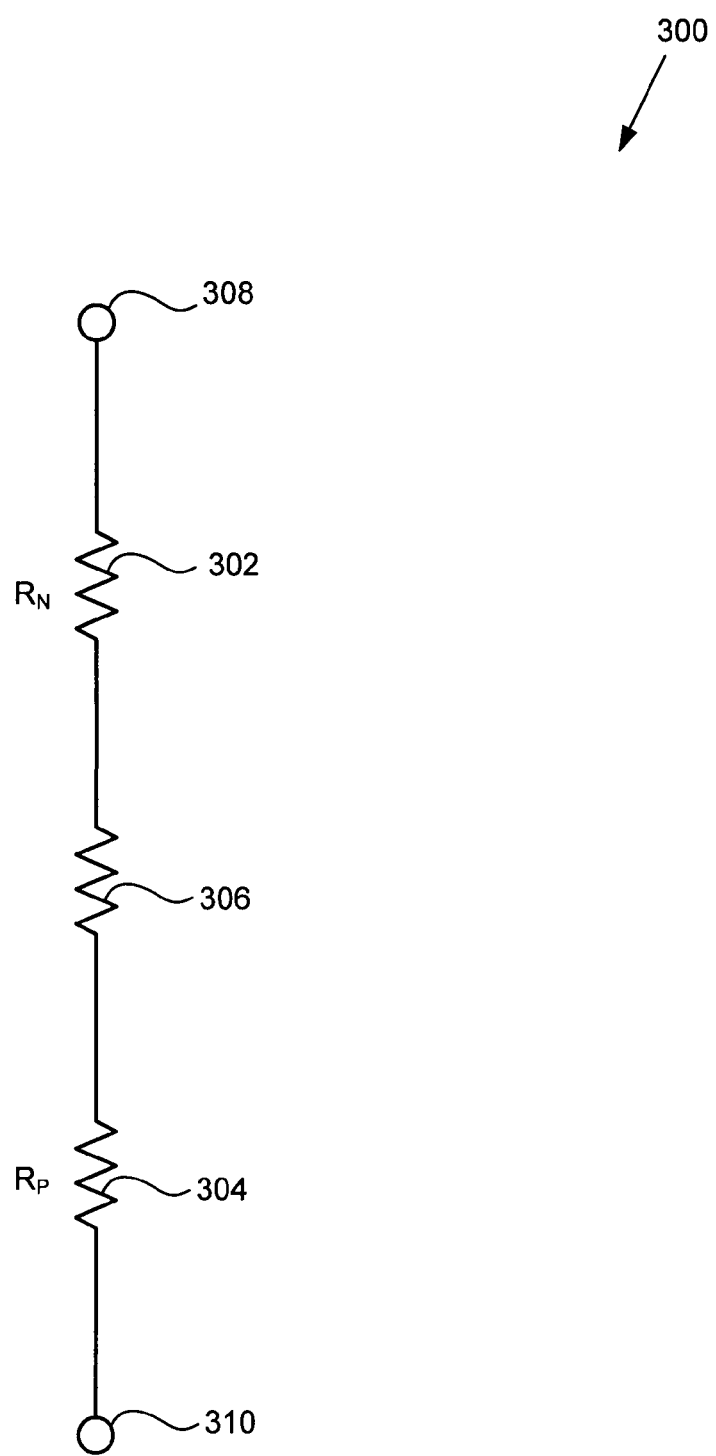
FIG. 3 illustrates a schematic diagram of the exemplary programmable poly fuse of FIGS. 1A and 1B after programming in accordance with one embodiment of the present invention.

FIG. 3 shows a schematic diagram corresponding to poly fuse 102 in structure 100 of FIGS. 1A and 1B after programming. In diagram 300, resistors 302 and 304 and N side and P side terminals 308 and 310 correspond, respectively, to resistors 202 and 204 and N side and P side terminals 208 and 210 in diagram 200 in FIG. 2. After programming, the P-N junction formed at interface 120, which is represented by diode 206 in diagram 200 in FIG. 2, can be represented by resistor 306 having resistance equal to $R_D$, i.e., a fuse resistance, which can be, for example, less than approximately 10.0 ohms. Thus, after programming, poly fuse 102 in FIGS. 1A and 1B can have a resistance equal to $R_N+R_D+R_P$, where $R_N$ and $R_P$ are each substantially greater than $R_D$. Thus, after programming, poly fuse 102 can have a resistance between N side terminal 308 and P side terminal 310 substantially equal to $R_N+R_D$, which can be, for example, approximately 10.0 kilo ohms or less. The relatively low, permanent resistance of the poly fuse 102 after programming can be associated with a logic state of "1" or "0," depending on application requirements.

Figure 4:
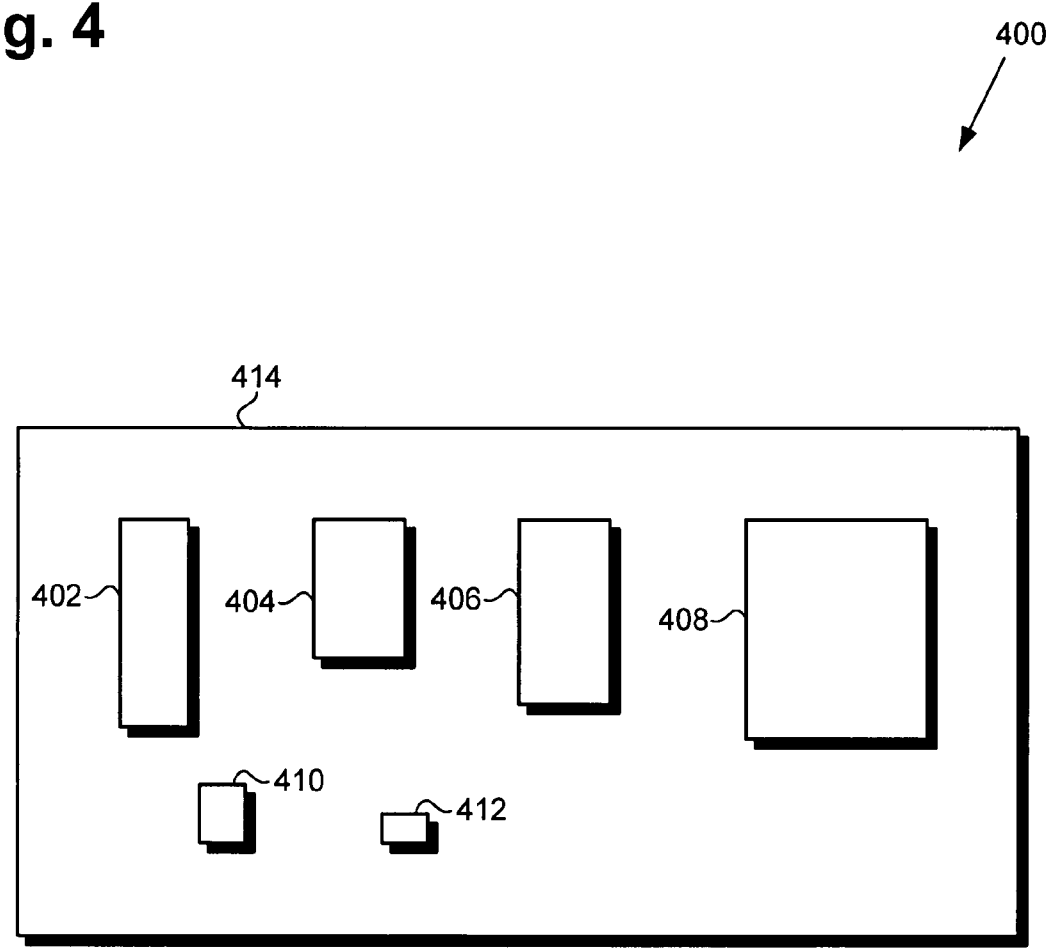
FIG. 4 illustrates a diagram of an exemplary electronic system including an exemplary chip or die utilizing one or more programmable poly fuses in accordance with one embodiment of the present invention.

FIG. 4 illustrates a diagram of an exemplary electronic system including an exemplary chip or die including one or more of the invention's programmable poly fuses in accordance with one embodiment of the present invention. Electronic system 400 includes exemplary modules 402, 404, and 406, IC chip or semiconductor die 408, discrete components 410 and 412, residing in and interconnected through circuit board 414. In one embodiment, electronic system 400 may include more than one circuit board. IC chip 408 can include one or more of the invention's programmable poly fuses, such as poly fuse 102 in FIGS. 1A and 1B, as described above.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electromechanical motor control module, or a field programmable gate array (FPGA), or any other kind of module utilized in modern electronic circuit boards. Circuit board 414 can include a number of interconnect traces (not shown in FIG. 4) for interconnecting modules 402, 404, and 406, discrete components 410 and 412, and IC chip 408.

Also shown in FIG. 4, IC chip 408 is surface mounted on circuit board 414 and includes one or more of an embodiment of the invention's programmable poly fuses. In one embodiment, IC chip 408 may be mounted on a substrate in a semiconductor package, which can be in turn mounted on circuit board 414. In another embodiment, IC chip 408 may not be mounted on circuit board 414, and may be interconnected with other modules on different circuit boards. Further shown in FIG. 4, discrete components 410 and 412 are mounted on circuit board 414 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

Thus, the present invention provides a programmable poly fuse that requires a low programming voltage, provides a permanent programmed state, does not utilize gate oxide breakdown for programming, and does not require multiple programming cycles. As a result, the invention advantageously achieves a programmable poly fuse having increased scalability and reliability compared to a conventional poly gate fuse. Also, by requiring a significantly lower programming voltage, the invention's programmable poly fuse advantageously avoids problems typically caused by a high programming voltage, such as increased leakage current in associated circuitry.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a programmable poly fuse has been described.

The invention claimed is:

1. A programmable poly fuse comprising:
   a region comprising a P-N junction formed by a P type resistive poly segment adjoining an N type resistive poly segment;
   a P side silicided poly line contiguous with said P type resistive poly segment and coupled to a P side terminal of said fuse;
   an N side silicided poly line contiguous with said N type resistive poly segment and coupled to an N side terminal of said fuse;
   wherein a portion of said P-N junction forms a conduction path through said programmable poly fuse after programming; and
   wherein a silicide layer does not form in said region before and after said programming.

2. The programmable poly fuse of claim 1, wherein said P side terminal is connected to at least one metal contact.

3. The programmable poly fuse of claim 1, wherein said N side terminal is connected to at least one metal contact.

4. The programmable poly fuse of claim 1, wherein said programmable poly fuse is situated over a shallow trench isolation region.

5. The programmable poly fuse of claim 1, wherein said programmable poly fuse is situated over a field oxide region.

6. The programmable poly fuse of claim 1, wherein a voltage applied to said N side terminal during a normal operating mode of said programmable poly fuse is less than or equal to approximately 2.5 volts.

7. The programmable poly fuse of claim 1, wherein a voltage higher than approximately 3.5 volts is applied at said N side terminal to break down said P-N junction.

8. An electronic system comprising:
   a die comprising at least one programmable poly fuse, said at least one programmable poly fuse comprising:
   a region comprising a P-N junction formed by a P type resistive poly segment adjoining an N type resistive poly segment;
   a P side silicided poly line contiguous with said P type resistive poly segment and coupled to a P side terminal of said fuse;
   an N side silicided poly line contiguous with said N type resistive poly segment and coupled to an N side terminal of said fuse;
   wherein a portion of said P-N junction forms a conduction path through said programmable poly fuse after programming; and
   wherein a silicide layer does not form in said region before and after said programming.

9. The electronic system of claim 8, wherein said P side terminal is connected to at least one metal contact.

10. The electronic system of claim 8, wherein said N side terminal is connected to at least one metal contact.

11. The electronic system of claim 8, wherein said programmable poly fuse is situated over a shallow trench isolation region.

12. The electronic system of claim 8, wherein said programmable poly fuse is situated over a field oxide region.

13. A programmable poly fuse comprising:
    a region comprising a P-N junction formed by a P type resistive poly segment adjoining an N type resistive poly segment;
    a P side silicided poly line adjacent to said P type resistive poly segment and coupled to a P side terminal of said fuse;
    wherein a portion of said P-N junction forms a conduction path through said programmable poly fuse after programming; and
    wherein a silicide layer does not form in said region before and after said programming.

14. The programmable poly fuse of claim 13 further comprising an N side silicided poly line adjacent to said N type resistive poly segment and coupled to an N side terminal of said fuse.

15. The programmable poly fuse of claim 13, wherein said programmable poly fuse is situated over a shallow trench isolation region.

16. The programmable poly fuse of claim 13, wherein said programmable poly fuse is situated over a field oxide region.

17. The programmable poly fuse of claim 13, wherein a voltage applied to said programmable poly fuse during a normal operating mode is less than or equal to approximately 2.5 volts.

18. The programmable poly fuse of claim 13, wherein a voltage higher than approximately 3.5 volts is applied to said programmable poly fuse to break down said P-N junction.

19. The programmable poly fuse of claim 13, wherein said P side terminal is connected to at least one metal contact.

20. The programmable poly fuse of claim 14, wherein said N side terminal is connected to at least one metal contact.

* * * * *